(12) United States Patent
Furusawa et al.

(10) Patent No.: US 8,518,488 B2
(45) Date of Patent: Aug. 27, 2013

(54) METHOD FOR USING APPARATUS CONFIGURED TO FORM GERMANIUM-CONTAINING FILM

(75) Inventors: Yoshikazu Furusawa, Nirasaki (JP); Mitsuhiro Okada, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 429 days.

(21) Appl. No.: 12/707,193

(22) Filed: Feb. 17, 2010

(65) Prior Publication Data

US 2010/0210094 A1    Aug. 19, 2010

(30) Foreign Application Priority Data

Feb. 19, 2009 (JP) ................................. 2009-036831

(51) Int. Cl.
*C23C 16/00* (2006.01)
*H01L 21/205* (2006.01)

(52) U.S. Cl.
USPC ..................................... 427/255.7; 427/248.1

(58) Field of Classification Search
None
See application file for complete search history.

(56) References Cited

U.S. PATENT DOCUMENTS

| 4,717,681 A * | 1/1988 | Curran ........................... 438/314 |
| 2002/0045966 A1* | 4/2002 | Lee et al. ....................... 700/121 |
| 2003/0205237 A1* | 11/2003 | Sakuma .......................... 134/1.1 |
| 2005/0181586 A1* | 8/2005 | Kurokawa et al. ............ 438/522 |

FOREIGN PATENT DOCUMENTS

| JP | 2003-77845 | 3/2003 |
| JP | 2008-283126 | 11/2008 |
| KR | 10-2005-0037953 | 4/2005 |
| KR | 10-2008-0031634 | 4/2008 |

* cited by examiner

*Primary Examiner* — Joseph Miller, Jr.
(74) *Attorney, Agent, or Firm* — Oblon, Spivak, McClelland, Maier & Neustadt, L.L.P.

(57) ABSTRACT

A method for using an apparatus configured to form a germanium-containing film includes performing a first film formation process for forming a first product film containing germanium by CVD on a product target object placed inside a reaction container, a first cleaning process for etching the film formation by-product, a second cleaning process for removing residual germanium from inside the reaction container, and a second film formation process for forming a second product film containing no germanium by CVD on a product target object placed inside the reaction container, in this order. The second cleaning process is performed by exhausting gas from inside the reaction container with no product target object placed therein, supplying a second cleaning gas containing an oxidizing gas and hydrogen gas into the reaction container, and heating an interior of the reaction container thereby activating the second cleaning gas.

11 Claims, 4 Drawing Sheets

METHOD FOR USING APPARATUS CONFIGURED TO FORM GERMANIUM-CONTAINING FILM

CROSS-REFERENCE TO RELATED PATENT APPLICATION

This application claims the benefit of priority from Japanese Patent Application No. 2009-036831, filed on Feb. 19, 2009, in the Japan Patent Office, the disclosure of which is incorporated herein in the entirety by reference.

BACKGROUND OF THE INVENTION

1. Field of the Invention

The present invention relates to a method for using a film formation apparatus for a semiconductor process, which is configured to form a film containing Ge (germanium) on a target object, such as a semiconductor wafer. The term "semiconductor process" used herein includes various kinds of processes which are performed to manufacture a semiconductor device or a structure having wiring layers, electrodes, and the like to be connected to a semiconductor device, on a target object, such as a semiconductor wafer or a glass substrate used for an FPD (Flat Panel Display), e.g., an LCD (Liquid Crystal Display), by forming semiconductor layers, insulating layers, and conductive layers in predetermined patterns on the target object.

2. Description of the Related Art

Conventionally, for example, poly-silicon is used as a material for gate electrodes of transistors. Gate electrodes of poly-silicon can be easily depleted, when supplied with a bias voltage. As the thickness of gate insulating films decreases, this becomes prominent, which is one of the causes of device properties being deteriorated. In order to solve this problem, it has been studied to employ silicon germanium, which has a higher dopant activation rate, in place of silicon. It has also been studied to employ silicon germanium in other devices, such as diodes. For example, Jpn. Pat. Appln. KOKAI Publication No. 2003-77845 discloses a method for forming a silicon germanium film on the surface of a semiconductor wafer. This method employs a vertical heat processing apparatus, which supplies mono-silane ($SiH_4$) gas and mono-germane ($GeH_4$) gas to form a silicon germanium film by CVD (Chemical Vapor Deposition).

There is a case where one vertical heat processing apparatus is used to form a silicon germanium film on a first lot of wafers and then form anther thin film, such as a silicon film, on a second lot of wafers. In general, germanium contained in a process gas used in the preceding heat process can be a contaminant for a film, such as a silicon film, formed by the subsequent heat process. If germanium is mixed into the silicon film, device properties may be deteriorated.

Where the subsequent heat process is a silicon film formation process, a so-called pre-coating process is performed to cover the inner surface of the reaction container and so forth with a pre-coating film before the silicon film formation process. The pre-coating film prevents germanium from being scattered into the process atmosphere from by-product films, which contain silicon germanium as the main component (it means 50% or more), deposited inside the reaction container.

However, as described later, the present inventors have found that conventional methods for using a film formation apparatus for a semiconductor process of this kind have room for improvement in terms of problems concerning germanium contamination.

BRIEF SUMMARY OF THE INVENTION

An object of the present invention is to provide a film formation apparatus for a semiconductor process, which reliably solves problems concerning germanium contamination.

According to a first aspect of the present invention, there is provided a method for using an apparatus configured to form a germanium-containing film, the method comprising: performing a first film formation process for forming a first product film containing germanium by CVD on a product target object placed inside a reaction container, by supplying a germanium source gas into the reaction container and heating an interior of the reaction container thereby activating the germanium source gas, wherein the first film formation process brings about a film formation by-product deposited inside the reaction container and containing germanium; performing a first cleaning process for etching the film formation by-product, subsequent to the first film formation process, by exhausting gas from inside the reaction container with no product target object placed therein, supplying a first cleaning gas containing a halogen into the reaction container, and heating an interior of the reaction container thereby activating the first cleaning gas; performing a second cleaning process for removing residual germanium from inside the reaction container, subsequent to the first cleaning process, by exhausting gas from inside the reaction container with no product target object placed therein, supplying a second cleaning gas containing an oxidizing gas and hydrogen gas into the reaction container, and heating an interior of the reaction container thereby activating the second cleaning gas, wherein the oxidizing gas is selected from the group consisting of oxygen gas, ozone gas, and a compound gas of nitrogen and oxygen; and performing a second film formation process for forming a second product film containing no germanium by CVD on a product target object placed inside the reaction container, subsequent to the second cleaning process, by supplying a film formation process gas into the reaction container and heating an interior of the reaction container thereby activating the film formation process gas.

According to a second aspect of the present invention, there is provided a method for using an apparatus configured to form a germanium-containing film, the apparatus comprises a reaction container configured to accommodate a plurality of target objects at intervals in a vertical direction, a support member configured to support the target objects inside the reaction container, a heater disposed around the reaction container and configured to heat the target objects, an exhaust system configured to exhaust gas from inside the reaction container, a gas supply system configured to supply, into the reaction container, a silicon source gas, a germanium source gas, and gases for cleaning an interior of the reaction container, and a control section configured to control an operation of the apparatus, the method comprising: performing a first film formation process for forming a first product film containing silicon germanium by CVD on product target objects placed inside the reaction container, by supplying the silicon source gas and the germanium source gas into the reaction container and heating an interior of the reaction container thereby activating the silicon source gas and the germanium source gas, wherein the first film formation process brings about a film formation by-product deposited inside the reaction container and containing silicon germanium; performing a first cleaning process for etching the film formation by-product, subsequent to the first film formation process, by exhausting gas from inside the reaction container with no product target objects placed therein, supplying a first cleaning gas containing fluorine and hydrogen into the reaction container, and heating an interior of the reaction container thereby activating the first cleaning gas; performing a second cleaning process for removing residual germanium from inside the reaction container, subsequent to the first cleaning process, by exhausting gas from inside the reaction container with no product target objects placed therein, supplying a second cleaning gas containing an oxidizing gas and hydrogen gas into the reaction container, and heating an interior of the reaction container thereby activating the second cleaning gas, wherein the oxidizing gas is selected from the group consisting of oxygen gas, ozone gas, and a compound gas of nitrogen and oxygen; and performing a second film formation process for forming a second product film containing silicon and no germanium by CVD on product target objects placed inside the reaction container, subsequent to the second cleaning process, by supplying the silicon source gas into the reaction container and heating an interior of the reaction container thereby activating the silicon source gas.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
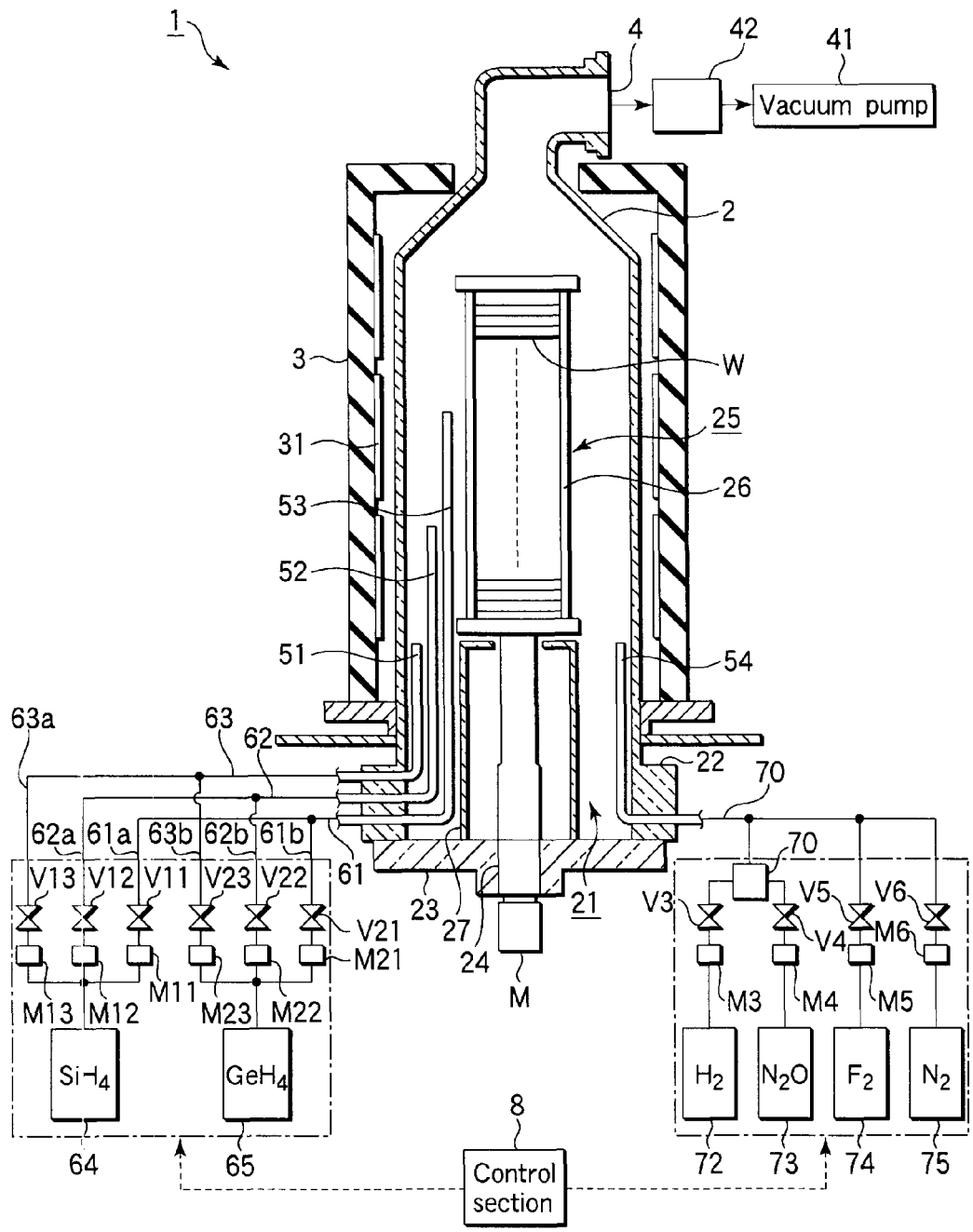
FIG. 1 is a sectional side view showing a vertical heat processing apparatus (film formation apparatus) according to an embodiment of the present invention.

In the process of developing the present invention, the inventors studied problems with regard to conventional methods for using a film formation apparatus for a semiconductor process. As a result, the inventors have arrived at the findings given below.

As described above, where one vertical heat processing apparatus is used to form a silicon germanium film on a first lot of wafers and then form a silicon film on a second lot of wafers, a pre-coating process is performed to cover the inner surface of the reaction container and so forth with a silicon film immediately before the process on the second lot. However, the process temperature for forming silicon germanium films by thermal CVD is lower than the process temperature for forming poly-silicon films by thermal CVD. For this reason, poly-silicon films may be insufficiently formed at positions with a lower temperature, such as positions around the load port formed at the bottom of the reaction container and thus distant from the heater, and cannot cover by-product films containing silicon germanium as the main component at these positions.

On the other hand, when by-product films containing silicon oxide or nitride as the main component deposited inside the reaction container are removed, a cleaning gas containing a halogen, such as fluorine, is supplied into the reaction container to perform etching on by-product films. However, in the case of by-product films containing silicon germanium as the main component, even if they are etched by, e.g., fluorine gas, germanium remains on the inner surface of the reaction container and the surface of the wafer coat.

In light of this, conventionally, where one vertical heat processing apparatus is used to form a silicon germanium film on a first lot of wafers and then form a silicon film on a second lot of wafers, a pre-coating process is performed therebetween without a step of etching and removing by-product films containing silicon germanium as the main component. It should be noted that, even if the pre-coating process is performed after the step of etching and removing by-product films, residual germanium cannot be sufficiently covered at positions with a lower temperature, such as positions around the load port, where formation of poly-silicon films is insufficient.

Accordingly, the present inventors shifted the viewpoint and made repeated experiments to reliably remove residual germanium of this kind, and have found that active species of oxidizing gas and hydrogen gas are effective for this removing process. Although the inventors do not know prior art documents disclosing a technique for removing residual germanium of this kind, the following document can provide a reference material. Specifically, Jpn. Pat. Appln. KOKAI Publication No. 2008-283126 (see paragraphs [0030] to [0031] and FIGS. 1 and 2) discloses a method for removing metals, such as copper, contained in quartz used as the material of reaction containers. According to this method, a cleaning gas is first supplied into a reaction container to remove by-product films and thereby to expose the quartz inner surface of the reaction container. Then, hydrogen gas and oxygen gas are supplied into the reaction container to remove the metals contained in the quartz surface by radicals of These gases.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

FIG. 1 is a sectional side view showing a vertical heat processing apparatus (film formation apparatus) according to an embodiment of the present invention. This vertical heat processing apparatus 1 is designed as a film formation apparatus to form a silicon germanium film (SiGe film) and a silicon film (Si film) by thermal CVD.

As shown in FIG. 1, the heat processing apparatus (film formation apparatus) 1 includes a cylindrical reaction container 2, which is made of, e.g., quartz and directed vertically. The reaction container 2 is opened at the bottom to form a load port 21, around which a flange 22 is integrally formed. A lid 23 made of, e.g., quartz is disposed below the reaction container 2, so that the lid 23 can come into contact with the bottom of the flange 22 to airtightly close the port 21. The lid 23 is moved up and down by a boat elevator (not shown) to open and close the port. A rotary shaft 24 extends through the center of the lid 23, and supports a substrate holder or wafer boat 25 at the top.

The wafer boat 25 includes three or more, e.g. four, struts 26. The struts 26 have grooves (slots) to support a plurality of, e.g., 125, target objects or semiconductor wafers W stacked at intervals. The 125 wafers W consist of dummy wafers disposed at the top and bottom sides, and product wafers placed therebetween. The bottom of the rotary shaft 24 is connected to a motor M for rotating the rotary shaft 24, so that the wafer boat 25 is rotated by the motor M. A heat-insulating unit 27 is disposed on the lid 23 and surrounds the rotary shaft 24.

An exhaust port 4 is formed at the top of the reaction container 2 to exhaust the interior of the reaction container 2. The exhaust port 4 is connected to an exhaust line provided with a vacuum pump 41 and a pressure control mechanism 42 to vacuum-exhaust the interior of the reaction container 2 to a desired vacuum level. A furnace 3 is disposed around the reaction container 2, and includes a heater 31 for heating up the interior of the reaction container 2. The heater 31 is formed of a carbon wire heater, which allows a process to be performed with least contamination, i.e., at high cleanness, and allows temperature to be quickly increased and decreased.

First to third injectors 51 to 53 each having an L-shape are disposed to extend through the flange 22 at the bottom of the reaction container 2, and are used to supply process gases onto the wafers W inside the reaction container 2. In FIG. 1, the three injectors 31 to 53 are shown as being inserted into the flange 22 at the same position, for the sake of convenience. However, in fact, the injectors 51 to 53 are disposed side by side equidistantly in the annular direction of the flange 22 and are gathered in one area to be close to each other in the annular direction, so that maintenance can be easily performed.

The injectors 51 to 53 have different lengths, such that the gas supply ports at their distal end (tip openings) are positioned at different heights. The distal end of the shortest first injector 51 is positioned, e.g., near the bottom level of the range for holding wafers W in the wafer boat 25. The distal end of the middle-length second injector 52 is positioned, e.g., slightly below the central level of the range for holding wafers W in the wafer boat 25. The distal end of the longest third injector 53 is positioned, e.g., between the top level of the range for holding wafers W in the wafer boat 25 and the distal end of the second injector 52. The layout of the injectors 51 to 53 is not limited to that shown in FIG. 1, and their lengths are suitably set based on experimental results or the like.

The proximal ends of the injectors 51 to 53 extending outside the flange 22 are respectively connected to gas supply lines 61 to 63, i.e., gas supply passages. The proximal end of the gas supply line 61 is connected to gas supply lines 61a and 61b. The proximal end of the gas supply line 62 is connected to gas supply lines 62a and 62b. The proximal end of the gas supply line 63 is connected to gas supply lines 63a and 63b. The gas supply lines 61a, 62a, and 63a are connected to a supply source 64 of a silane family gas, such as mono-silane gas ($SiH_4$ gas). The gas supply lines 61b, 62b, and 63b are connected to a supply source 65 of a germane family gas, such as mono-germane gas ($GeH_4$ gas). In this embodiment, the mono-germane gas is a gas diluted to 10% by hydrogen gas.

The gas supply lines 61a, 62a, and 63a for supplying mono-silane gas are respectively provided with mass-flow controllers M11 to M13 used as flow rate regulators and valves V11 to V13 disposed thereon. The gas supply lines 61b, 62b, and 63b for supplying mono-germane gas are respectively provided with mass-flow controllers M21 to M23 and valves V21 to V23 disposed thereon. The flow rates of mono-silane gas and mono-germane gas can be adjusted for each of the mixture gases supplied from the injectors 51 to 53, independently of each other.

Further, an injector 54 having an L-shape is disposed to extend through the flange 22 at the bottom of the reaction container 2, and is used to supply cleaning gases into the reaction container 2. The cleaning gases are used to remove by-product films of reaction products generated during film formation and deposited inside the reaction container 2, wherein the by-product films contains SiGe or Si as the main component (it means 50% or more), depending on the type of film formation. The gas supply port at the distal end (tip opening) of the injector 54 is positioned near the bottom level of the range for holding wafers W in the wafer boat 25.

The proximal end of the injector 54 extending outside the flange 22 is connected to a gas supply line 71. The cleaning gas supply line 71 is connected to a supply source 74 of a halogen-containing gas through a valve V5 and a mass-flow controller M5. For example, the gas supply source 74 is configured to supply a halogen sour gas, such as fluorine ($F_2$) gas or hydrogen fluoride (HF) gas. In this embodiment, fluorine gas is used as the halogen-containing gas, and so the gas supply source 74 is shown with a symbol "$F_2$" in FIG. 1, for the sake of convenience.

Further, the cleaning gas supply line 71 is connected to a supply source 72 of hydrogen ($H_2$) gas Through a valve V3 and a mass-flow controller M3. The cleaning gas supply line 71 is also connected to a supply source 73 of dinitrogen monoxide ($N_2O$) gas serving as an oxidizing gas through a valve V4 and a mass-flow controller M4. The gas supply sources 72 and 73 are connected to the cleaning gas supply line 71 through a gas mixer 70, so that the hydrogen gas and dinitrogen monoxide gas are supplied into the cleaning gas supply line 71 in a sufficiently mixed state. Furthermore, the cleaning gas supply line 71 is connected to a supply source 75 of nitrogen gas through a valve V6 and a mass-flow controller M6.

Accordingly, the cleaning gas supply line 71 can selectively supply fluorine gas, hydrogen gas, dinitrogen monoxide gas, and nitrogen gas at predetermined flow rates. In this embodiment, a mixture of fluorine gas and nitrogen gas or a mixture of fluorine gas, hydrogen gas, and nitrogen gas is used as a first cleaning gas for etching by-product films containing SiGe as the main component, and a mixture of hydrogen gas and dinitrogen monoxide gas is used as a second cleaning gas for removing residual germanium (Ge).

Specifically, in the vertical heat processing apparatus 1, an SiGe film is first formed by a heat process and then a film containing no Ge, such as an Si film, is formed by a heat process. Before the later heat process, the first cleaning gas is used to etch by-product films containing SiGe as the main component, and then a second cleaning gas is used to remove residual germanium (Ge) from inside the reaction container 2.

In this embodiment, the first and second cleaning gases are supplied through the common line 71 and injector 54 into the reaction container 2. However, the first and second cleaning gases may be supplied through respective dedicated supply lines and injectors into the reaction container 2.

Further, this vertical heat processing apparatus 1 includes a control section 8 configured to control the operation of the heater 31, pressure control mechanism 42, gas supply sources 64, 65, 72, 73, 74, and 75, and so forth. The control section 8 comprises a computer including, e.g., a CPU and a storage section that stores programs. The programs includes a group of steps (commands) for controlling the vertical heat processing apparatus 1 to conduct various operations necessary for performing film formation on the wafers W and cleaning inside the process container 2. For example, this program is stored in a storage medium, such as a hard disk, compact disk, magneto-optical disk, or memory card, and is installed therefrom into the computer.

Next, an explanation will be given of an example of a method for using the vertical heat processing apparatus 1 described above. First, a predetermined number of wafers W are placed at intervals and stacked on the wafer boat 25, and the wafer boat 25 is then moved up by the boat elevator (not shown). With this operation, the wafer boat 25 is loaded into the reaction container 2, and the load port 21 of the flange 22 is closed by the lid 23 (the state shown in FIG. 1).

Figure 2A:
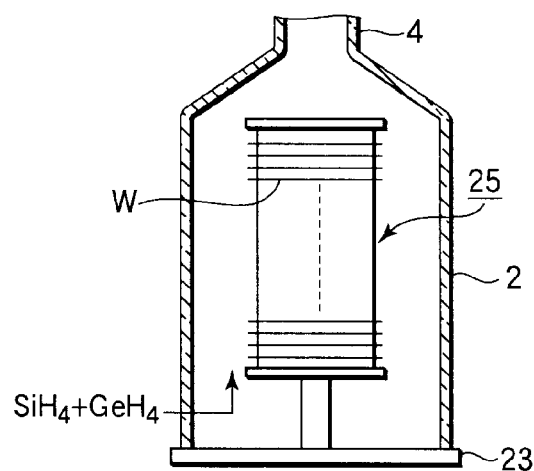
FIGS. 2A, 2B, and 2C are views for explaining a method for using the apparatus shown in FIG. 1.

Then, the interior of the reaction container 2 is vacuum-exhausted through the exhaust line by the vacuum pump 41, and the process field, in which the wafer boat 25 is placed, is adjusted to have a vacuum atmosphere of, e.g., 10 to 130 Pa (133 Pa=1 Torr) by the pressure control mechanism 42. Further, the reaction container 2 is heated by the heater 31, and the process field is stabilized at a process temperature of, e.g., 300 to 650° C. Then, mono-silane gas and mono-germane gas are respectively supplied from the supply sources 64 and 65 and are mixed by the gas supply lines 61 to 63 and injectors 51 to 53. Then, the mixture gases are respectively supplied from the distal end supply ports of the injectors 51 to 53 into the process field inside the reaction container 2 (FIG. 2A).

The injectors 51 to 53 are given different mixture ratios between the process gases, i.e., mono-silane gas and mono-germane gas. The mixture ratio at the injector 51 is set to be [mono-silane gas]/[mono-germane gas]=1,200 sccm/600 sccm. The mixture ratio at the injector 52 is set to be [mono-silane gas]/[mono-germane gas]=300 sccm/190 sccm. The mixture ratio at the injector 53 is set to be [mono-silane gas]/[mono-germane gas]=300 sccm/220 sccm. In other words, according to this embodiment, the ratio of mono-silane gas relative to mono-germane gas in the mixture gas ([mono-silane gas]/[mono-germane gas]) is set to be lower as the position of the supply ports of the injectors is higher. It should be noted that, the mono-germane gas in this embodiment is a mono-germane gas diluted to 10% by hydrogen gas, as described above.

The mono-silane gas and mono-germane gas thus supplied react with each other by thermal decomposition in the process field, and an SiGe film (silicon germanium film) is thereby formed on the surface of the wafers W. During this film formation, the wafer boat 25 is rotated by the motor M, so that the SiGe film is uniformly formed on the surface of each wafer W.

It should be noted that the activation energy of mono-germane is lower and thus the decomposition reactivity thereof is higher. If mono-germane is supplied solely from the bottom into the reaction container 2, less mono-germane is present at the upper part of the wafer boat 25. In this respect, the apparatus shown in FIG. 1 employs three injectors 51 to 53 with heights different from each other. Consequently, mono-germane supplied from the injectors 52 and 53 compensates for a shortfall of mono-germane supplied from the lower injector 51.

Rather than being separately supplied from each other, mono-silane gas and mono-germane gas are mixed in advance, and supplied into the reaction container 2 thorough the injectors 51 to 53. When mono-germane is supplied into the process field, it has been diluted by mono-silane, which has a higher activation energy and thus a lower decomposition reactivity. In this case, the mono-germane is prevented by the mono-silane from causing an excessive decomposition reaction.

After the deposition of SiGe is thus performed for a predetermined time, supply of the process gases is stopped, and the interior of the reaction container 2 is replaced with an inactive gas, such as $N_2$ gas. Then, the wafer boat 25 is unloaded from the reaction container 2.

During the SiGe film formation described above, reaction products containing SiGe as the main component (it means 50% or more) are deposited on the surface of various components, such as the reaction container 2 and wafer boat 25, exposed to the atmosphere of the supplied process gases. The reaction products form by-product films on the surface of these components, and increase the thickness as the film formation is repeatedly performed.

In this embodiment, the process for forming an SiGe film is performed on a first lot of wafers, as described above, and then a process for forming an Si film is performed on a second lot of wafers. Accordingly, cleaning inside the reaction container 2 is performed between the processes on the first and second lots to prevent Ge contamination.

Specifically, after the process for forming an SiGe film, the wafer boat 25 in an empty state, i.e., with no wafers W supported thereon, is loaded into the reaction container 2, which has been purged with $N_2$ gas, and the load port 21 is closed by the lid 23. Then, while gas is continuously exhausted from inside the reaction container 2, a first cleaning process and a second cleaning process are performed in this order. The first cleaning process is performed to etch by-product films containing SiGe as the main component inside reaction container 2. The second cleaning process is performed to remove residual Ge inside the reaction container.

In the first cleaning process, the reaction container 2 is set to have therein a vacuum pressure of 1,064 to 199,950 Pa, such as 13,300 Pa, and a temperature of 200 to 400° C., such as about 300° C. Then, a first cleaning gas is supplied from the cleaning gas supply line 71 into the reaction container 2. For example, the first cleaning gas is formed of a mixture gas of $F_2$ gas at 2,000 sccm and $N_2$ gas at 8,000 sccm or a mixture gas of $F_2$ gas at 2,000 sccm, $H_2$ gas at 2,000 sccm, and $N_2$ gas at 8,000 sccm.

Figure 2B:
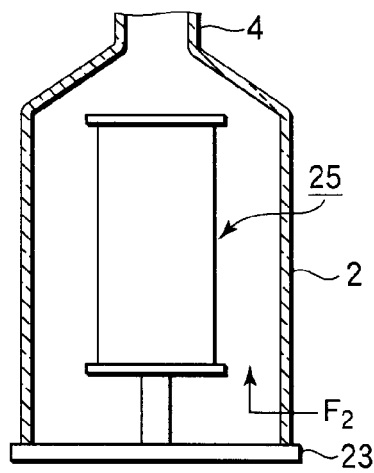

When the first cleaning gas is supplied into the heated reaction container 2, the mixture gas is activated and fluorine radicals are thereby generated. These radicals act to etch and remove by-product films present on the inner surface of the reaction container 2 and the surface of various components inside the reaction container, such as the wafer boat 25 (FIG. 2B). After the etching of by-product films is thus performed for a predetermined time, the gas supplied into the reaction container 2 is switched from the first cleaning gas to $N_2$ gas to finish the first cleaning process.

Then, in the second cleaning process, the reaction container 2 is depressurized to have therein a vacuum pressure of 13.3 to 931 Pa, and preferably of 13.3 to 133 Pa, such as 46.55 Pa, and is heated to have therein a temperature of 750 to 950° C., such as 850° C. Then, a second cleaning gas is supplied from the cleaning gas supply line 71 into the reaction container 2. For example, the second cleaning gas is formed of a mixture gas of $H_2$ gas at 1,000 sccm and $N_2O$ gas at 1,700 sccm or a mixture gas of $H_2$ gas at 1,700 sccm and $N_2O$ gas at 2,000 sccm.

Figure 2C:
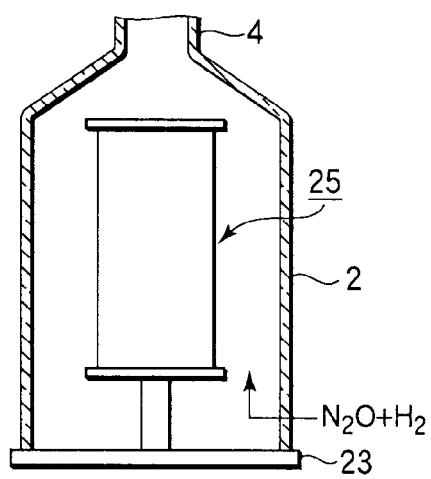

When the second cleaning gas is supplied into the heated reaction container 2, the mixture gas is activated and hydrogen radicals and oxygen radicals are thereby generated. These radicals act to react with residual Ge inside the reaction container 2 and take it into gas, thereby discharging it out of the reaction container 2 (FIG. 2C). After the removal of residual Ge is thus performed for a predetermined time of, e.g., 5 hours, the gas supplied into the reaction container 2 is switched from the second cleaning gas to $N_2$ gas to finish the second cleaning process.

Figure 3A:
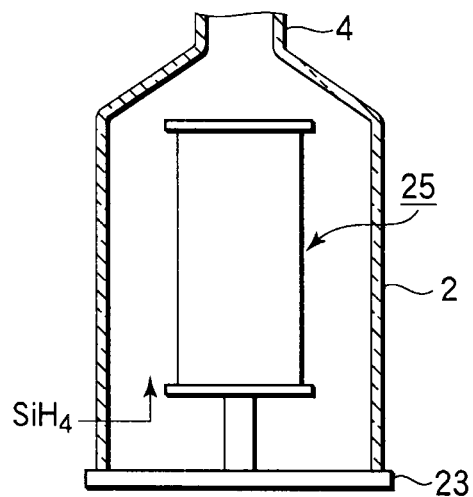
FIGS. 3A and 3B are views for explaining a method for using the apparatus shown in FIG. 1.

Then, while the empty wafer boat 25 is still placed inside the reaction container 2, the pressure and temperature inside the reaction container 2 are adjusted to be the conditions for Si film formation, such as a pressure of 13.3 to 133 Pa, such as 26.6 Pa and a temperature of 400 to 650° C., such as 620° C. Then, mono-silane gas from the supply source 64 is supplied at, e.g., 80 sccm from the injectors 51 to 53 into the reaction container 2 to perform a pre-coating process for covering the inner surface of the reaction container 2, the surface of the wafer boat 25, and so forth with a pre-coating film (a poly-silicon film in this embodiment) (FIG. 3A). For example, the pre-coating process is performed for 100 minutes to form a pre-coating film of 1 μm. The pre-coating process is thus performed after the second cleaning process, so that a trace amount of metal elements remaining on the surface of various components is covered up with the pre-coating film. Consequently, it is possible to reliably prevent contamination to the Si film to be formed After the pre-coating process is finished, the wafer boat 25 is unloaded. Specifically, nitrogen gas is supplied into the reaction tube 2 at a predetermined flow rate, so that the pressure inside the reaction container 2 is returned to atmospheric pressure. Then, the lid 23 is moved down, and the empty wafer boat 25 is thereby unloaded from the reaction container 2.

Then, a predetermined number of wafers W as another lot for forming an Si product film are placed and stacked at intervals on the wafer boat 25, and the wafer boat 25 is then moved up by the boat elevator (not shown). With this operation, the wafer boat 25 is loaded into the reaction container 2, and the load port 21 of the flange 22 is closed by the lid 23 (the state shown in FIG. 1)

Figure 3B:
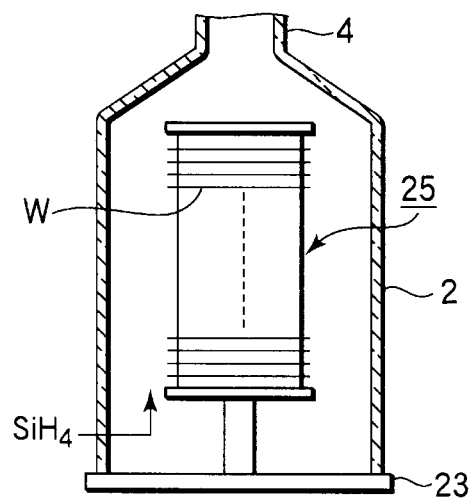

Then, the interior of the reaction container 2 is vacuum-exhausted through the exhaust line by the vacuum pump 41, and the reaction container 2 is adjusted to have a vacuum atmosphere by the pressure control mechanism 42. Further, the process field, in which the wafer boat 25 is placed, inside the reaction container 2 is stabilized by the heater 31 at a process temperature. Then, mono-silane gas from the supply source 64 is supplied from the injectors 51 to 53 into the process field inside the reaction container 2 (FIG. 3B).

Where a poly-silicon film is formed as the Si product film, the process pressure is set at 13.3 to 133 Pa, such as 26.6 Pa, the process temperature is set at 400 to 650° C., such as 620° C., and the mono-silane gas is supplied at, e.g., 300 sccm. Where an amorphous silicon film is formed as the Si product film, the process pressure is set at 13.3 to 266 Pa, such as 26.6 to 66.5 Pa, the process temperature is set at 300 to 570° C., such as 530° C., and the mono-silane gas is supplied at, e.g., 200 to 1,000 sccm.

The mono-silane gas thus supplied is thermally decomposed in the process field, and an Si film (Si product film) is thereby formed on the surface of the wafers W. During this film formation, the wafer boat 25 is rotated by the motor M, so that the Si film is uniformly formed on the surface of each wafer W.

After the deposition of Si is thus performed for a predetermined time, supply of the process gases is stopped, and the interior of the reaction container 2 is replaced with an inactive gas, such as $N_2$ gas. Then, the wafer boat 25 is unloaded from the reaction container 2.

As described with reference to FIGS. 2A to 3B, the method for using the vertical heat processing apparatus 1 according to an embodiment of the present invention described above is arranged to execute the SiGe formation process, first cleaning process, second cleaning process, pre-coating process, and Si film formation process in this order. In this sequence, the pre-coating process of a poly-silicon film is performed at a temperature of, e.g., about 620° C., and the SiGe film formation process is performed at a temperature of, e.g., 300 to 500° C., lower than that of the pre-coating process.

As a comparative example, for example, it is assumed that the sequence of processes described above is changed such that the pre-coating process is performed after the first cleaning process without the second cleaning process performed therebetween. In this case, residual Ge cannot be sufficiently covered at positions with a lower temperature inside the reaction container 2, such as positions around the load port, where formation of poly-silicon films is insufficient, as described previously. Consequently, an Si film formed by the subsequent film formation will be contaminated with Ge remaining at these positions.

Further, as another comparative example, it is assumed that the sequence of processes described above is changed such that the second cleaning process is performed before the first cleaning process. In this case, by-product films containing SiGe as the main component deposited inside the reaction container 2 are oxidized by oxygen radicals and oxide films are thereby formed. The oxide films thus formed can be hardly etched by the first cleaning gas, and so it becomes difficult to perform etching and removing the by-product films.

For the reasons described above, the order of the respective processes is preferably set as explained with reference to FIGS. 2A to 3B.

In the embodiment described above, the second cleaning process is arranged to use $N_2O$ gas as a gas for removing residual Ge. This is so because, in general, vertical heat processing apparatuses for forming an Si film may include a supply line of $N_2O$ gas, which is used for doping the Si film with O as an impurity to make grain size of the Si film smaller. However, another gas may be used as the oxidizing gas for removing residual Ge, such as oxygen gas, ozone gas, or another compound gas of nitrogen and oxygen (e.g., NO or $NO_2$).

Experiment

In the vertical heat processing apparatus 1 described above, a usage method according to a present example PE of the embodiment described above and usage methods according to comparative examples CE1, CE2, and CE3 were implemented to confirm effects of the embodiment. Common to the present example PE and comparative examples CE1, CE2, and CE3, a film formation process was performed to form an SiGe film having a thickness of about 5 μm on the surface of quartz substrates supported on the upper side and lower side of the wafer boat 25. In the present example PE, after this film formation process, the first and second cleaning processes were performed in the order and under the conditions as described with reference to FIGS. 2A and 2B, in accordance with the manner described below. In the comparative examples CE1, CE2, and CE3, after this film formation process, different processes were performed in accordance with the manners described below. Thereafter, the number of Ge atoms per unit area [number/$cm^2$] remaining on the substrates was measured. The number of Ge atoms was measured by use of ICP-MS (Inductively Coupled Plasma Mass Spectrometer).

Comparative Example CE1

Wet cleaning was performed by immersing the quartz substrates with an SiGe film formed thereon in a hydrofluoric and nitric acid solution for several minutes.

Comparative Example CE2

Coating was performed by covering the surface of the quartz substrates with a poly-silicon film having a thickness of 1 µm.

Comparative Example CE3

The first cleaning process for etching the SiGe film was performed for about one hour by supplying the first cleaning gas ($F_2+N_2$) into the reaction container 2 accommodating the quartz substrates placed on the wafer boat 25.

Present Example PE

The first cleaning process was performed as in the comparative example CE3, and then the second cleaning process for removing residual Ge was performed for about five hours by supplying the second cleaning gas ($H_2+N_2O$) into the reaction container 2 accommodating the quartz substrates placed on the wafer boat 25.

Experimental Results

Figure 4:
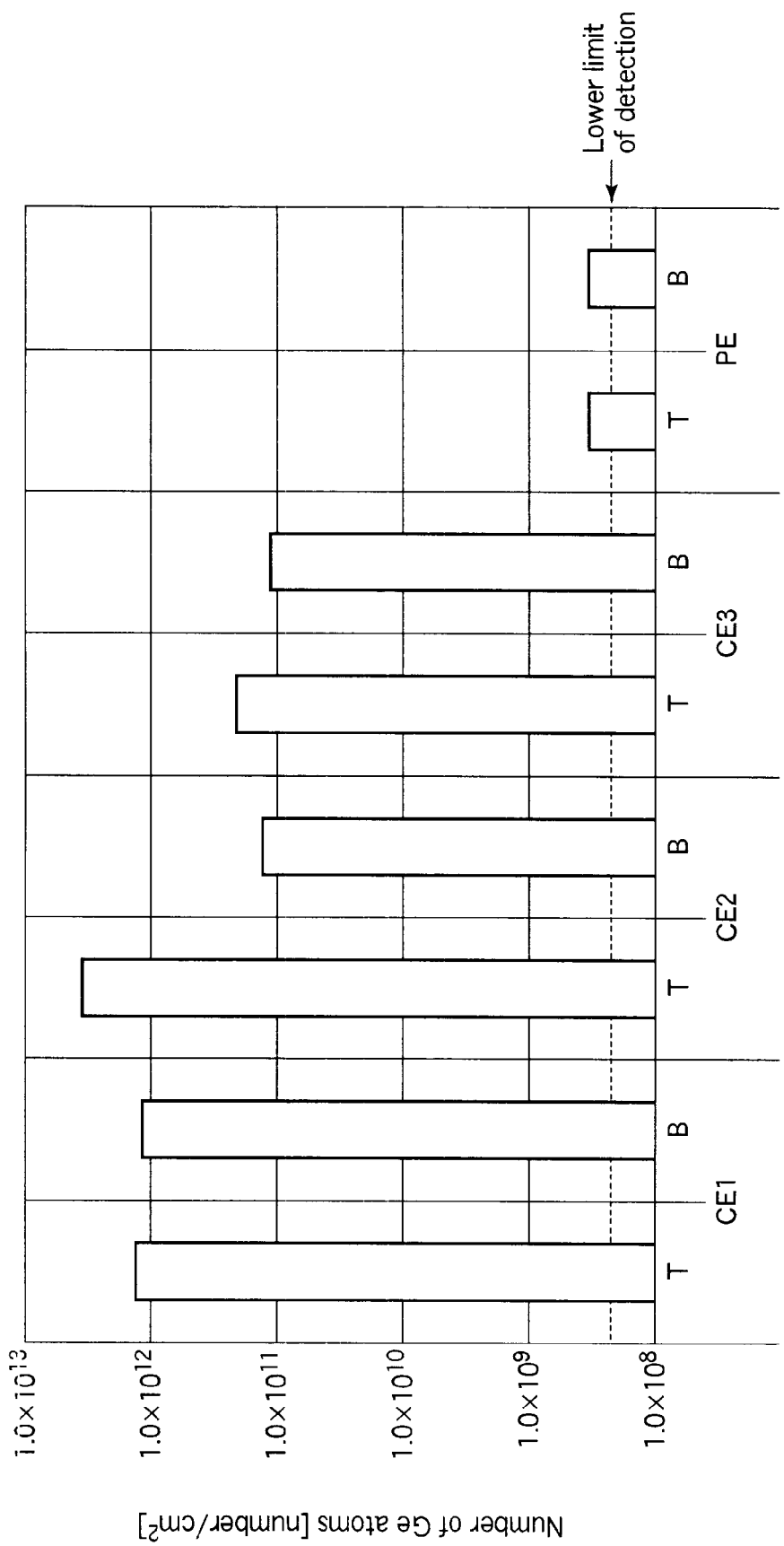
FIG. 4 is a graph showing results of an experiment of removing germanium by a method for using an apparatus according to an embodiment of the present invention.

FIG. 4 is a graph showing results of the experiment conducted on the present example PE and comparative examples CE1, CE2, and CE3. In FIG. 4, the symbol "T" shown along the horizontal axis denotes the measurement on the substrate supported on the upper side of the wafer boat 25 and the symbol "B" denotes the measurement on the substrate supported on the lower side of the wafer boat 25. The vertical axis denotes the measured number of Ge atoms [number/cm$^2$].

Comparative Example CE1

Wet Cleaning

The measured number of Ge atoms was higher than $1.0 \times 10^{12}$ [number/cm$^2$] on either of the substrates on The upper and lower sides of the wafer boat 25. Accordingly, it has been confirmed that Ge is not sufficiently removed by wet cleaning alone. Further, The cleaning solution in the cleaning vessel was contaminated with Ge.

Comparative Example CE2

Poly-Silicon Film Coating

The measured number of Ge atoms was higher than $3.0 \times 10^{12}$ [number/cm$^2$] on the substrate on the upper side of the wafer boat 25, while the measured number of Ge atoms was higher than $1.0 \times 10^{11}$ [number/cm$^2$] on the substrate on the lower side. Accordingly, it has been confirmed that the effect of preventing Ge contamination can be hardly obtained by the pre-coating performed in a state where Ge is still remaining.

Comparative Example CE3

First Cleaning Process

The measured number of Ge atoms was around $1.0 \times 10^{11}$ to $2.0 \times 10^{11}$ [number/cm$^2$] on either of the substrates on the upper and lower sides of the wafer boat 25. Accordingly, it has been confirmed that the effect of removing Ge is insufficient also in this case.

Present Example PE

First and Second Cleaning Processes

The measured number of Ge atoms was around $3.0 \times 10^8$ [number/cm$^2$] on either of the substrates on the upper and lower sides of the wafer boat 25. This value was close to the lower limit of the ICP-MS measuring range, and thus the effect of removing Ge was remarkably improved as compared with the comparative examples. Specifically, it has been confirmed that the first and second cleaning processes according to the embodiment of the present invention is effective to prevent Ge contamination.

In the embodiment, the film formation apparatus employed is a processing apparatus of the batch type laving a single-tube structure. However, for example, the present invention may be applied to a vertical processing apparatus of the batch type having a process container of the double-tube type, which is formed of inner and outer tubes. Alternatively, the present invention may be applied to a horizontal processing apparatus of the batch type or a processing apparatus of the single-substrate type. The target substrate is not limited to a semiconductor wafer W, and it may be a glass substrate for, e.g., an LCD.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for using an apparatus configured to form a silicon germanium film, the method comprising:
   performing a first film formation process for forming the silicon germanium film as a first product film by CVD on a product target object placed inside a reaction container, by supplying a silicon source gas and a germanium source gas into the reaction container and heating an interior of the reaction container thereby activating the silicon source gas and the germanium source gas, wherein the first film formation process brings about a film formation by-product deposited inside the reaction container and containing silicon germanium;
   performing a first cleaning process for etching the film formation by-product, subsequent to the first film formation process, by exhausting gas from inside the reaction container with no product target object placed therein, supplying a first cleaning gas containing a halogen into the reaction container, and heating the interior of the reaction container thereby activating the first cleaning gas, wherein the first cleaning process uses a process temperature of 200 to 400° C. and a process pressure of 1,064 to 199,950 Pa;
   performing a second cleaning process for removing residual germanium from inside the reaction container, subsequent to the first cleaning process, by exhausting gas from inside the reaction container with no product target object placed therein, supplying a second cleaning gas containing an oxidizing gas and hydrogen gas into the reaction container, and heating the interior of the reaction container thereby activating the second cleaning gas, wherein the oxidizing gas is selected from the group consisting of oxygen gas, ozone gas, and a compound gas of nitrogen and oxygen, and the second cleaning process uses a process temperature of 750 to 950° C. and a process pressure of 13.3 to 133 Pa;

performing a pre-coating process for covering an inner surface of the reaction container with a silicon coating film, subsequent to the second cleaning process, by supplying the silicon source gas into the reaction container with no product target object placed therein and heating the interior of the reaction container thereby activating the silicon source gas; and performing a second film formation process for forming a silicon film as a second product film by CVD on a product target object placed inside the reaction container, subsequent to the pre-coating process, by supplying the silicon source gas into the reaction container and heating the interior of the reaction container thereby activating the silicon source gas.

2. The method according to claim 1, wherein the pre-coating process uses a process temperature higher than that of the first film formation process.

3. The method according to claim 1, wherein the halogen of the first cleaning gas is fluorine.

4. The method according to claim 1, wherein the oxidizing gas of the second cleaning gas is a compound gas of nitrogen and oxygen.

5. The method according to claim 1, wherein the first film formation process uses a process temperature of 300 to 650° C. and a process pressure of 10 Pa to 130 Pa.

6. A method for using an apparatus configured to form a silicon germanium film, the apparatus including
a reaction container configured to accommodate a plurality of target objects at intervals in a vertical direction,
a support member configured to support the target objects inside the reaction container,
a heater disposed around the reaction container and configured to heat an interior of the reaction chamber,
an exhaust system configured to exhaust gas from inside the reaction container,
a gas supply system configured to supply, into the reaction container, a silicon source gas, a germanium source gas, $N_2O$ gas, and gases for cleaning the interior of the reaction container, and
a control section configured to control an operation of the apparatus, the method comprising:

performing a first film formation process for forming the silicon germanium film as a first product film by CVD on product target objects placed inside the reaction container, by supplying the silicon source gas and the germanium source gas into the reaction container and heating the interior of the reaction container thereby activating the silicon source gas and the germanium source gas, wherein the first film formation process brings about a film formation by-product deposited inside the reaction container and containing silicon germanium;

performing a first cleaning process for etching the film formation by-product, subsequent to the first film formation process, by exhausting gas from inside the reaction container with no product target objects placed therein, supplying a first cleaning gas containing fluorine and hydrogen into the reaction container, and heating the interior of the reaction container thereby activating the first cleaning gas, wherein the first cleaning process uses a process temperature of 200 to 400° C. and a process pressure of 1,064 to 199,950 Pa;

performing a second cleaning process for removing residual germanium from inside the reaction container, subsequent to the first cleaning process, by exhausting gas from inside the reaction container with no product target objects placed therein, supplying a second cleaning gas containing an oxidizing gas and hydrogen gas into the reaction container, and heating the interior of the reaction container thereby activating the second cleaning gas, wherein the oxidizing gas is the $N_2O$ gas, and the second cleaning process uses a process temperature of 750 to 950° C. and a process pressure of 13.3 to 133 Pa;

performing a pre-coating process for covering an inner surface of the reaction container with a silicon coating film, subsequent to the second cleaning process, by supplying the silicon source gas into the reaction container with no product target object placed therein and heating the interior of the reaction container thereby activating the silicon source gas; and performing a second film formation process for forming a silicon film as a second product film by CVD on product target objects placed inside the reaction container, subsequent to the pre-coating process, by supplying the silicon source gas into the reaction container, heating the interior of the reaction container thereby activating the silicon source gas, and using the $N_2O$ gas to dope the silicon film with O as an impurity to make grain size of the silicon film smaller.

7. The method according to claim 6, wherein the pre-coating process uses a process temperature higher than that of the first film formation process.

8. The method according to claim 6, wherein the first film formation process uses a process temperature of 300 to 650° C. and a process pressure of 10 Pa to 130 Pa.

9. The method according to claim 6, wherein the second film formation process uses a process temperature of 400 to 650° C. and a process pressure of 13.3 to 133 Pa.

10. The method according to claim 1, wherein the oxidizing gas of the second cleaning gas is $N_2O$ gas.

11. The method according to claim 10, wherein the second film formation process includes using $N_2O$ gas to dope the silicon film with O as an impurity to make grain size of the silicon film smaller.

* * * * *